(12) United States Patent
Wang et al.

(10) Patent No.: US 12,086,018 B2
(45) Date of Patent: Sep. 10, 2024

(54) DATA RETENTION MANAGEMENT AFTER POWER OFF

(71) Applicant: Western Digital Technologies, Inc., San Jose, CA (US)

(72) Inventors: Lisha Wang, Fremont, CA (US); James Higgins, Chandler, AZ (US); Yongke Sun, Pleasanton, CA (US); Lanlan Gu, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 81 days.

(21) Appl. No.: 17/899,139

(22) Filed: Aug. 30, 2022

(65) Prior Publication Data

US 2024/0070003 A1 Feb. 29, 2024

(51) Int. Cl.
*G06F 11/07* (2006.01)
*G06F 1/30* (2006.01)
*G11C 29/52* (2006.01)

(52) U.S. Cl.
CPC .............. *G06F 11/076* (2013.01); *G06F 1/30* (2013.01); *G06F 11/073* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 8,966,343 B2 | 2/2015 | Syu et al. | |
| 9,263,136 B1* | 2/2016 | Zhao | G11C 16/349 |
| 9,543,025 B2* | 1/2017 | Fitzpatrick | G06F 12/0246 |
| 9,620,220 B2 | 4/2017 | Zhao et al. | |
| 10,185,609 B2 | 1/2019 | Lin | |
| 2012/0210076 A1 | 8/2012 | Jang et al. | |
| 2013/0007543 A1* | 1/2013 | Goss | G11C 16/349 |
| | | | 714/718 |
| 2014/0059405 A1* | 2/2014 | Syu | G11C 16/04 |
| | | | 711/E12.008 |
| 2014/0359202 A1 | 12/2014 | Sun et al. | |
| 2018/0181454 A1* | 6/2018 | Lin | G06F 11/0793 |
| 2022/0137815 A1* | 5/2022 | Nowell | G11C 29/028 |
| | | | 711/103 |

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017, doi: 10.1109/JPROC.2017.2713127. (Year: 2017).*

* cited by examiner

*Primary Examiner* — Daniel F. McMahon
(74) *Attorney, Agent, or Firm* — ARENTFOX SCHIFF LLP

(57) ABSTRACT

Aspects of the disclosure are directed to a storage device including a memory and a controller. In some examples, the controller is configured to measure an error rate of one or more blocks of the memory. In some examples, the controller is further configured to estimate, based at least in part on the error rate, a time shift indicative of a duration of time for which the storage device was powered off. In some examples, the controller is further configured to set a read level for multiple blocks of the memory, wherein the read level is determined based at least in part on the time shift.

18 Claims, 10 Drawing Sheets

DATA RETENTION MANAGEMENT AFTER POWER OFF

BACKGROUND

Field

This disclosure is generally related to electronic devices and more particularly to storage devices.

Introduction

Data storage, often called storage or memory, refers to computer components and recording media that retain digital data. Data storage is a core function and fundamental component of consumer and industrial electronics, especially devices such as computers, televisions, cellular phones, mobile devices, and digital video cameras.

Recently, forms of long-term storage other than electro-mechanical hard disks have become feasible for use in computers. A solid-state drive (SSD), including NOT-AND (NAND) flash, is one form of non-volatile memory used in solid-state storage devices. The memory cells are arranged in typical row and column fashion with circuitry for accessing individual cells. The memory transistors of those cells are placed to store an analog value that can be interpreted to hold two logical states in the case of single level cell (SLC) or more than two logical states in the case of multi-level cell (MLC).

A flash memory cell is light in weight, occupies very little space, and consumes less power than electromechanical disk drives. Construction of a storage system with this type of memory allows for much higher bandwidths and input/output operations per second (IOPS) than typical electro-mechanical disk drives. More importantly, it is especially rugged and can operate at a much high temperature range. It will withstand without adverse effects repeated drops, each of which would destroy a typical electromechanical hard disk drive. A problem exhibited by flash memory is memory latency after the drive has been off-line for a period of time. Thus, a need remains for better data management in memory devices.

SUMMARY

Certain aspects are directed to a storage device that includes a memory and a controller coupled to the memory. In some examples, the controller is configured to measure an error rate of one or more blocks of the memory. In some examples, the controller is configured to estimate, based at least in part on the error rate, a time shift indicative of a duration of time for which the storage device was powered off. In some examples, the controller is configured to set a read level for multiple blocks of the memory, wherein the read level is determined based at least in part on the time shift.

Certain aspects are directed to a method of management of data stored in a memory of a storage device. In some examples, the method comprises measuring an error rate of one or more blocks of the memory. In some examples, the method comprises estimating, based at least in part on the error rate, a time shift indicative of a duration of time for which the storage device was powered off. In some examples, the method comprises setting a read level for multiple blocks of the memory, wherein the read level is determined based at least in part on the time shift.

Certain aspects are directed to a storage device configured to store data in a memory. In some examples, the storage device includes means for measuring an error rate of one or more blocks of the memory. In some examples, the storage device includes means for estimating, based at least in part on the error rate, a time shift indicative of a duration of time for which the storage device was powered off. In some examples, the storage device includes means for setting a read level for multiple blocks of the memory, wherein the read level is determined based at least in part on the time shift.

Certain aspects are directed to a non-transitory computer-readable medium having instructions stored thereon that, when executed by a storage device controller, cause the storage device controller to perform operations. In some examples, the operations include measuring an error rate of one or more blocks of a memory. In some examples, the operations include estimating, based at least in part on the error rate, a time shift indicative of a duration of time for which the storage device was powered off. In some examples, the operations include setting a read level for multiple blocks of the memory, wherein the read level is determined based at least in part on the time shift.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
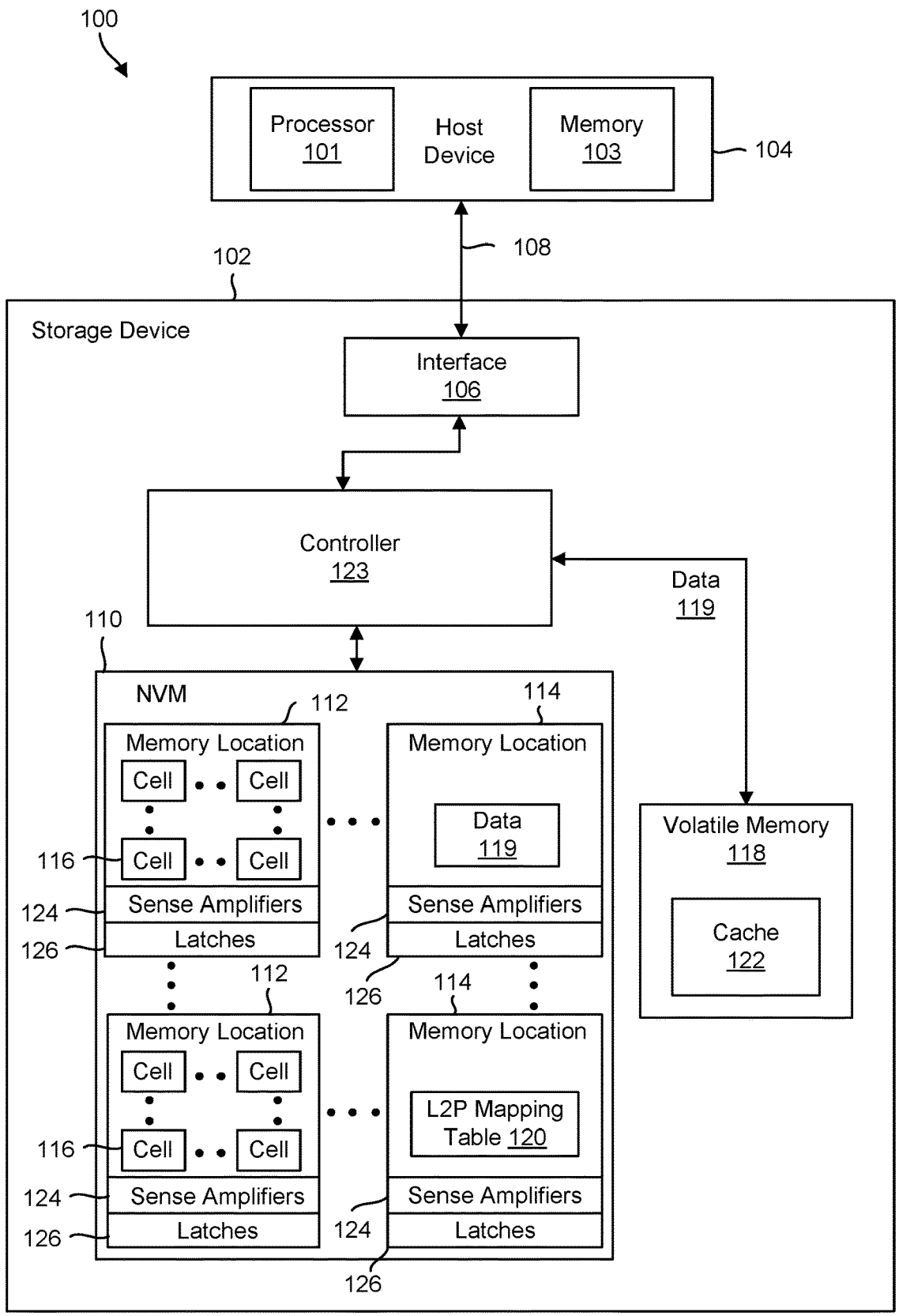
FIG. 1 is a block diagram illustrating an exemplary host/client and file system, as well as a network providing communication with other hosts/clients.

In the event of a solid-state device (SSD) shutdown (e.g., a hard shutdown or a soft shutdown), and after the SSD is powered back on, the SSD may undergo a data recovery and block refresh process. Errors in reading stored data may develop during a prolonged shutdown period, and this data loss can become more significant if the SSD shutdown is a hard shutdown, if the shutdown occurs when the SSD reaches the end of its warranted life (e.g., when the SSD is at the end of its life endurance rating), and/or if the SSD experiences relatively high temperatures while being powered off.

The data recovery and block refresh process may correct the errors, but host performance may be reduced during the correction time, and the correction time may be prolonged depending on the number of errors and/or the length of time that the SSD was powered off or otherwise powered off. For example, after powering on an SSD that has been in a powered off state for a long duration of time, a host computing device that uses the SSD may operate relatively slowly initially compared to a scenario where the SSD was under normal operating condition.

Accordingly, aspects of this disclosure are directed to a system and method to improve the host performance after an SSD have been powered off. For example, aspects are directed to enabling rapid read recovery, and reduced block refresh time. The features described herein are suitable for any flash memory controller device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host will be presented. These aspects are well suited for flash storage devices, such as SSDs, USB and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

FIG. 1 shows an exemplary block diagram 100 of a storage device 102 which communicates with a host device 104 (also "host") according to an exemplary embodiment.

The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magneto-resistive random-access memory (MRAM) devices, ferroelectric random-access memory (F-RAM), and any other type of non-volatile memory devices. In other examples, the host memory 103 may include volatile memory, such as random-access memory (RAM), dynamic random-access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g., 5G NR, 4G LTE, 3G, 2G, GSM/UMTS, CDMA One/CDMA2000, etc.), wireless distribution methods through access points (e.g., IEEE 802.11, WiFi, Hiper-LAN, etc.), Infrared (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., SLC memory, MLC memory, TLC memory, QLC memory, PLC memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random-Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g., NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

The storage device 102 and/or the host may include a non-transitory computer-readable medium having instructions stored thereon that, when executed by the storage device controller, cause the controller to perform operations described in this disclosure.

Figure 2:
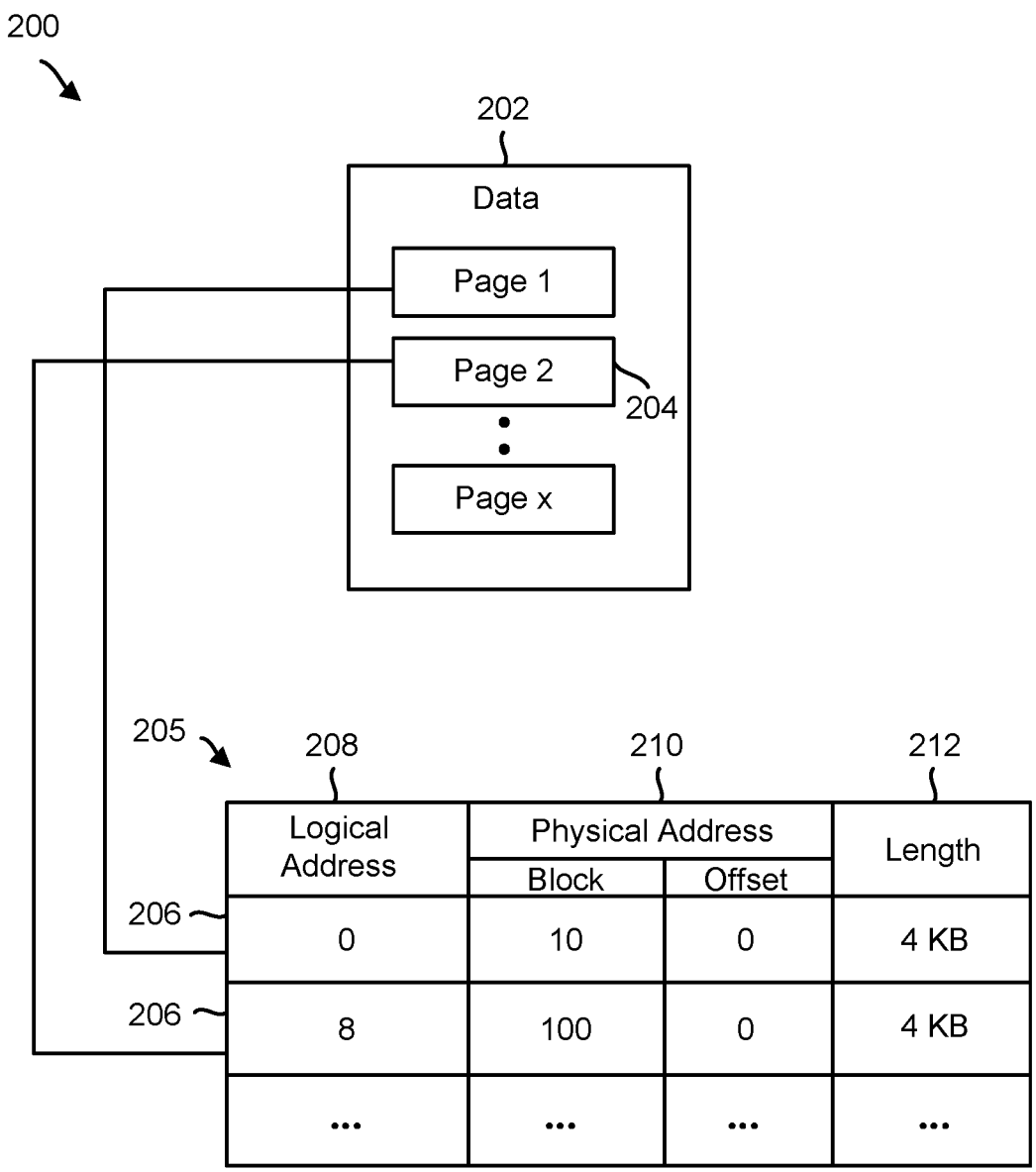
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g., 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g., it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g., readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g., translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104 and may be accessed by the controller 123 for execution by the one or more processors of the controller 123. Alternatively, the functions and components of the controller may be implemented with hardware in the controller 123 or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
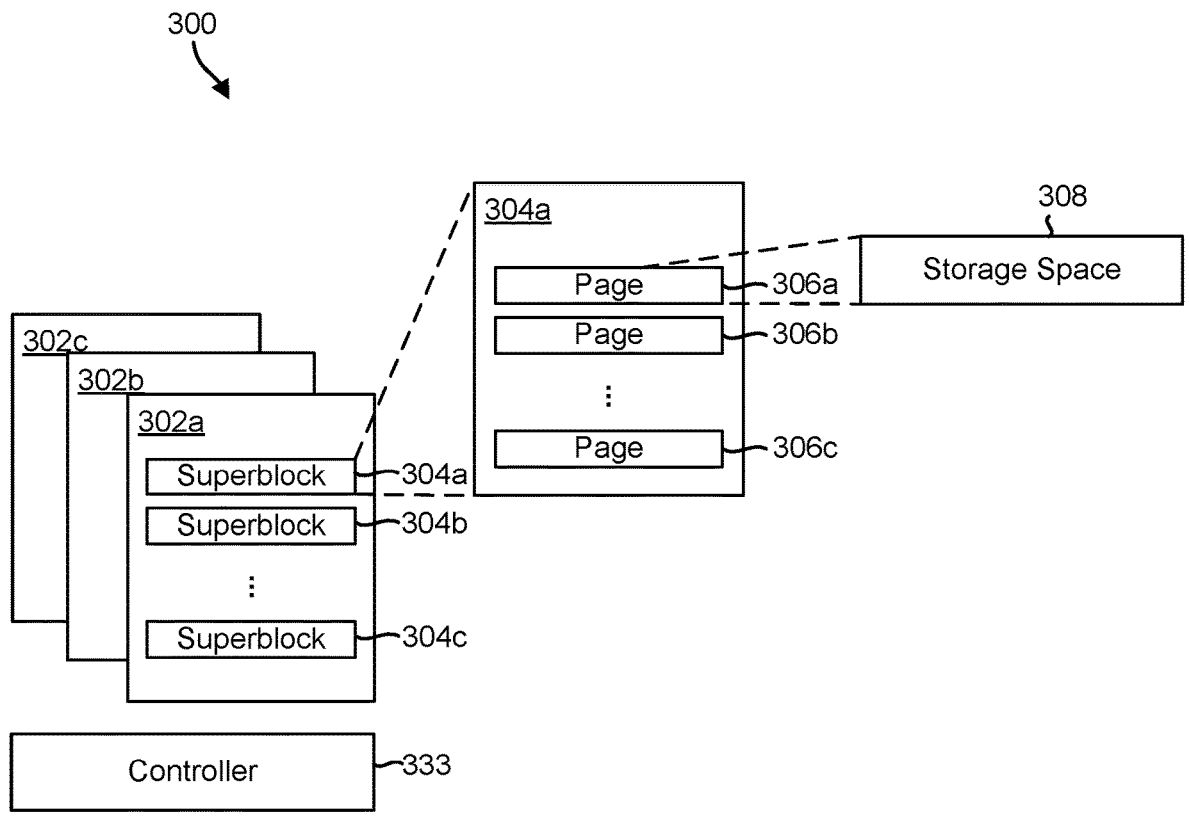
FIG. 3 is a block diagram conceptually illustrating an example hierarchical organization of non-volatile memory of the storage device of FIG. 1.

FIG. 3 is a block diagram conceptually illustrating an example hierarchical organization of a storage device (e.g., storage device 102 of FIG. 1). As described above in reference to FIG. 1, each memory location 112 may be a die 114 including multiple planes each including multiple blocks of multiple cells 116. As illustrated in FIG. 3, multiple dies (e.g., a first die 302a, a second die 302b, and a third die 302c—collective referred to as dies 302) may include multiple superblocks (e.g., a first superblock 304a, a second superblock 304b, and a third superblock 304c—collective referred to as superblock(s) 304), defined by multiple blocks of multiple cells. Each of which in turn comprises one or more pages (e.g., a first page 306a, a second page 306b, and a third page 306c—collective referred to as page(s) 306). In some embodiments, the storage device 300 has a capacity of approximately 512 GB, a superblock stores approximately 16 MB of data, and a page stores approximately 8 KB of data. It should be noted that these values are examples, and any suitable values may be used.

Each superblock is a grouping of one or more flash memory cells (e.g., flash blocks) that the controller 333 associates with a unique superblock address; the constituent flash blocks in a superblock 304 are typically physically contiguous. In some examples, the controller permits erasures (or "flashes") to occur only at the superblock-level, and does not permit erasures at the level of a superblock's constituent individual physical flash blocks. The pages 306 of a superblock may be defined by a physically contiguous grouping of one or more flash pages that the controller 333 associates with a unique combination of a superblock address and page addresses. Each page is a physically contiguous collection of memory cells in the solid-state memory that the controller associates with a unique combination of a superblock address and a page address.

Generally speaking, within a particular superblock 304, the controller 333 may implement only sequential write operations. In other words, the controller 333 may spread a first write operation to a first superblock 304a along the first set of contiguous pages 306 and begin a next, second write operation to the same first superblock 304a at the next contiguous page. Each page 306 includes storage space 308 defined by a collection of memory cells (e.g., 8 KB) within the page used to store user data, metadata, or raw data (e.g., data structures utilized by the storage device).

The term "block," as used throughout this disclosure may be used in connection with a superblock or a single block (e.g., multiples of which in the aggregate make up a superblock). That is, the functions described herein may be applied to a superblock or a block.

Example Data Recovery and Block Refresh Process

Figure 4:
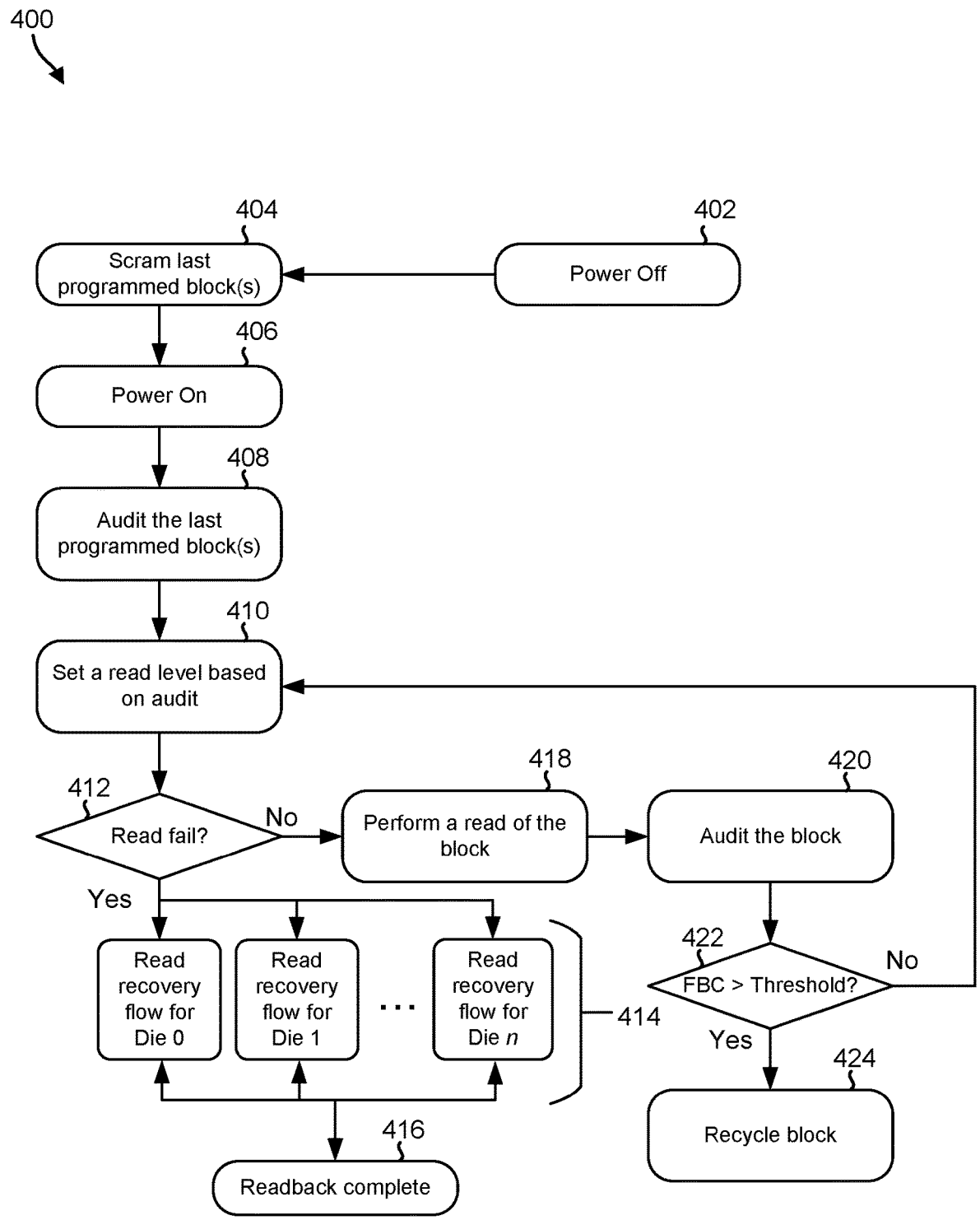
FIG. 4 is a flow chart illustrating an example process for data recovery and block refresh process of a storage device.

FIG. 4 is a flow chart illustrating an example process 400 for data recovery and block refresh process of a storage device (e.g., storage device 102 of FIG. 1). The process 400 may be performed by a controller (e.g., controller 123 of FIG. 1) of the storage device.

When the storage device is powered off 402, the controller may scram 404 the last programmed block(s) (e.g., the last one or more blocks to be written to prior to power off). For example, the controller may save the meta data associated with the last few blocks used for a write operation. When the device is powered on 406, the controller may audit 408 the few blocks to measure a bit error rate (BER) associated with each of the blocks. In some examples, the controller may use the measured BER to estimate a time shift (e.g., a duration of time that the storage device was powered off).

The controller may then set a read level at step 410 based at least on the time shift and/or a program erase cycle (PEC) of the few blocks. Every time stored data is accessed or read, the controller applies a certain voltage to a wordline storing the data. As the data is accessed more frequently, the read level voltage required to successfully read and/or decode the data increases. Similarly, when data is not accessed for a period of time (e.g., the time shift when the storage device is powered off), the read level voltage required to successfully read and/or decode the data decreases. The longer the duration of time, the greater the decrease. Similarly, temperature of the device (whether powered on or off) may also affect the read level voltage required for a successful read operation. Read errors may increase if the read level is not adjusted to account for the aforementioned changes in the read level voltages required to successfully read and/or decode the data. Such errors may increase the computation cost and processing time to successfully perform read operations.

The controller may then perform an initial read at step 412 of data from one or more blocks of each die in the storage device using the set read level to determine if the read passes or fails. If the read fails, the controller may perform a read recovery operation at step 414 for each failed die to complete the test read. That is, the controller may perform a recovery operation for each die separately and individually. It should be noted that in some cases, the recovery operations may take a significant amount of time depending on the number of failed dies. The recovery operations are complete 416 after a successful readback from each of the dies.

If the initial read 412 does not fail, then the controller may perform normal read operations 418. The controller may also audit 420 blocks (e.g., measure BER of the blocks individually) in the storage device as a background process during the normal read operations 418. If the audit 420 reveals that a particular block has a failed bit count (FBC), the controller may compare the FBC to a threshold value to determine 422 whether the FBC is equal to or greater than the threshold value. If the FBC is greater than or equal to the threshold value, then the controller may perform a data relocation process (e.g., a garbage collection operation) on the block and recycle 424 it. If the FBC is less than the threshold value, then the controller may continue to adjust the read level as necessary based on the audit 420 and/or PEC of the block.

In some examples, when an FBC is too high and a codeword cannot be corrected using normal read procedures (e.g., a normal read path), the controller may use a read recovery process for the recovery of data. In this regard, state-of-the-art NANDs or other high density NVM components of storage devices such as SSDs may seek to store as much data as possible in the transistors of the storage device, resulting in some percentage of reads that cannot be decoded using the normal read procedures, hence requiring some form of error correction by the controller to decode the data. These additional error correction procedures also may be referred to as a "read recovery flow" (RRF).

By way of example, to read data from a NAND, a read voltage value is selected and applied to the cells of the NAND. In response, some transistors within the NAND turn on, while others remain off, based on the amount of charge trapped in particular layers defined within the gates of the transistors. Normally, any responsive voltage that is lower than the read voltage is considered to be a binary one and anything higher that the sense voltage is considered to be a binary zero. The resulting binary values form a codeword that can be applied to a hard bit decoder to attempt to identify the data value that corresponds to the codeword to thereby readout the data. If the codeword is not decoded, i.e., it does not match stored codeword data, another read voltage value is selected and the procedure is repeated to generate another codeword, which is again applied to the hard bit decoder. If the data still cannot be read, additional reads may be performed at still different read values (e.g., different read voltage values). In some cases, soft bit information may be obtained for applying to a soft bit decoder. Various additional techniques may be applied to improve the chances of obtaining a decodable codeword. For example, the data storage controller may assess a gradient in FBC and, based on the gradient, the controller may determine a directionality to adjust the read values and, if possible, identify an optimal read value that provides the best chance of obtaining a decodable codeword (and thereby read out the data and, in so doing, recover from the initial errors that triggered the read recovery flow).

Thus, in some examples, read recovery may include the following main procedures: 1) determining which read value adjustment direction will reduce FBC (e.g., determining how to adjust read voltage values to improve the likelihood of obtaining a decodable codeword); 2) locating a minimal FBC read value (e.g., a read voltage value that will likely achieve a minimum FBC and hence a maximize the chances of obtaining a decodable codeword; 3) locating optimal read levels (e.g., voltage read values) to separate weak bits from strong bits; and 4) reading out the data.

It should be noted, that if the initial read 412 fails, the controller may determine the logical block address of the failed read data of the corresponding die and perform the RRF. That is, the controller may perform RRF for each individual die/block separately. As noted, such a process may take a significant amount of time if there are multiple errors across multiple dies.

Figure 5:
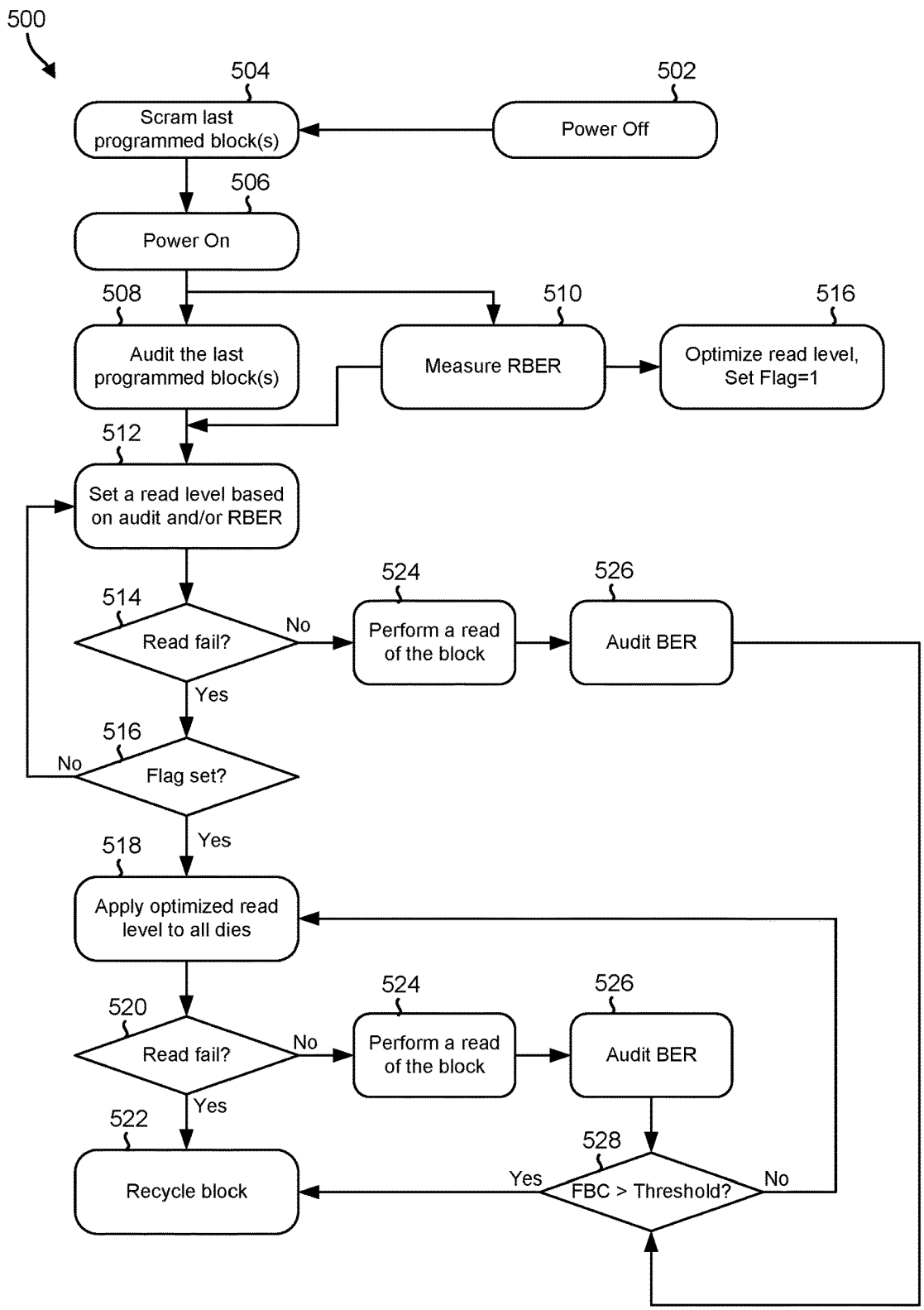
FIG. 5 is a flow chart illustrating an example process for data recovery and block refresh process of a storage device.

FIG. 5 is a flow chart illustrating an example process 500 for data recovery and block refresh process of a storage device (e.g., storage device 102 of FIG. 1). The process 500 may be performed by a controller (e.g., controller 123 of FIG. 1) of the storage device. It should be noted that one or more aspects of the example processes 400/500 of FIGS. 4 and 5 may be used interchangeably between the two processes.

Similar to FIG. 4, when the storage device is powered off 502, the controller may scram 504 the last programmed block(s) (e.g., the last few superblocks to be written to prior to power off). When the device is powered on 506, the controller may audit the few blocks at step 508 to measure a BER associated with each of the last programmed blocks, and measure a raw BER (RBER) 510 of the same blocks. The controller may use the measured RBER and/or the audited BER to estimate a time shift of the storage device. For example, the time shift may be estimated using both of the audited BER and a measured RBER. In such an example, the time shift may be a more accurate estimate relative to an estimate using only the audited BER. As such, using both the audited BER and measured RBER may result in a more accurate read level and fewer read errors. However, it should be noted that in some cases, the RBER may take longer to measure that the BER. In such a case, the time shift may be based only on the audited BER.

The controller may then estimate a read level 512 based on the estimated time shift, and apply the read level to all the dies so that an initial read from each die is made using the same read level. In a parallel process, the controller may determine an optimized read level based on the measured RBER. The controller may set a flag (e.g., 1-bit) indicating that the optimized read level has been determined.

The controller may perform an initial read operation at step 514 using the applied read level (e.g., as determined based on the time shift estimated from the BER audit, or as determined based on the time shift estimated from both the BER audit and the RBER). If the initial read fails, then the controller may check 516 if the optimized read level has been determined (e.g., check to see if the flag is set). If yes, the controller may set the read level at step 518 of all dies to the optimized read level. If the optimized read level has not been determined, the controller may adjust the read level of all dies according to a step function or any other suitable setting. Thus, the read level of the dies is set uniformly, reducing the amount of time required relative to a process where each die is individually set separate from the other dies.

In some examples, if the initial read fails, the controller may change the read level of all the dies to a common read level (e.g., the optimized read level) if a threshold condition is met. In some examples, the threshold condition is satisfied if a percentage of a particular number of reads fail (e.g., if 10% of the first 10 k reads fail, or any suitable percentage and number of reads). Thus, if a read fails but does not satisfy the threshold condition, the controller may change the read level of dies associated with the failed read(s) individually (e.g., the read recovery operation 414 of FIG. 4) instead of applying the common read level to all dies.

The controller may then perform a subsequent read at step 520 using the optimized read level. If the subsequent read fails, then the controller may perform a garbage collection process wherein a die associated with the failed read may be recycled 522.

If either of the initial read at step 514 or the subsequent read at step 520 fail, then the controller may perform normal read operations 524 using the set read value. The controller may also audit 526 blocks (e.g., measure BER of the blocks individually) in the storage device as a background process during the normal read operations 524. If the audit 526 reveals that a particular block has an FBC 528 equal to or greater than a threshold value, then the controller may perform a garbage collection operation on the block and recycle 522 it. If the FBC 528 is less than the threshold value, then the controller may continue to adjust the read level as necessary based on the audit 526 and/or PEC of the block.

Figure 6:
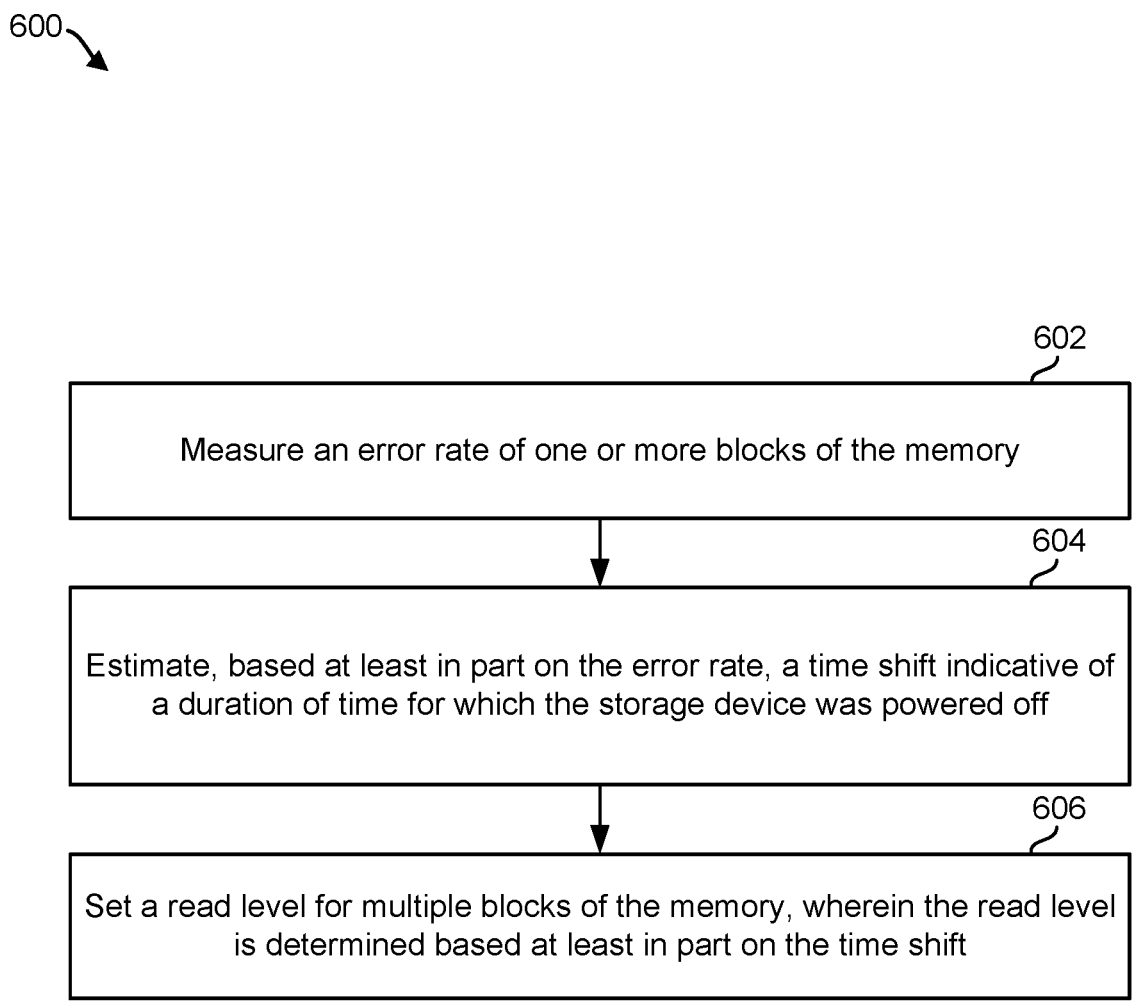
FIG. 6 is a flow diagram illustrating an example process for data recovery and block refresh process of a storage device.

FIG. 6 is a flow diagram illustrating an example process 600 for data retention after power off. The process 600 may be performed by a controller of a storage device (e.g., storage device 102 of FIG. 1). The process 600 may be performed by a controller of a storage device (e.g., storage device 102 of FIG. 1) and may be used in connection with one or more of the steps illustrated in FIGS. 7-9.

At 602, the controller may measure an error rate of one or more blocks of the memory. Here, the controller audits the scrammed blocks, as illustrated in 408 of FIG. 4, or audits the scrammed blocks at step 508 and/or measures the RBER 510 of FIG. 5. For example, the controller may measure the error rate to estimate a time shift.

At 604, the controller may estimate, based at least in part on the error rate, a time shift indicative of a duration of time for which the storage device was powered off.

At 606, the controller may set a read level for multiple blocks of the memory, wherein the read level is determined based at least in part on the time shift. Here, the controller may set a read level based on the audit, as illustrated in 410 of FIG. 4, or set a read level based on an audit and/or an RBER measurement, as illustrated in 512 of FIG. 5. The read level may be set for all dies in the memory.

Figure 7:
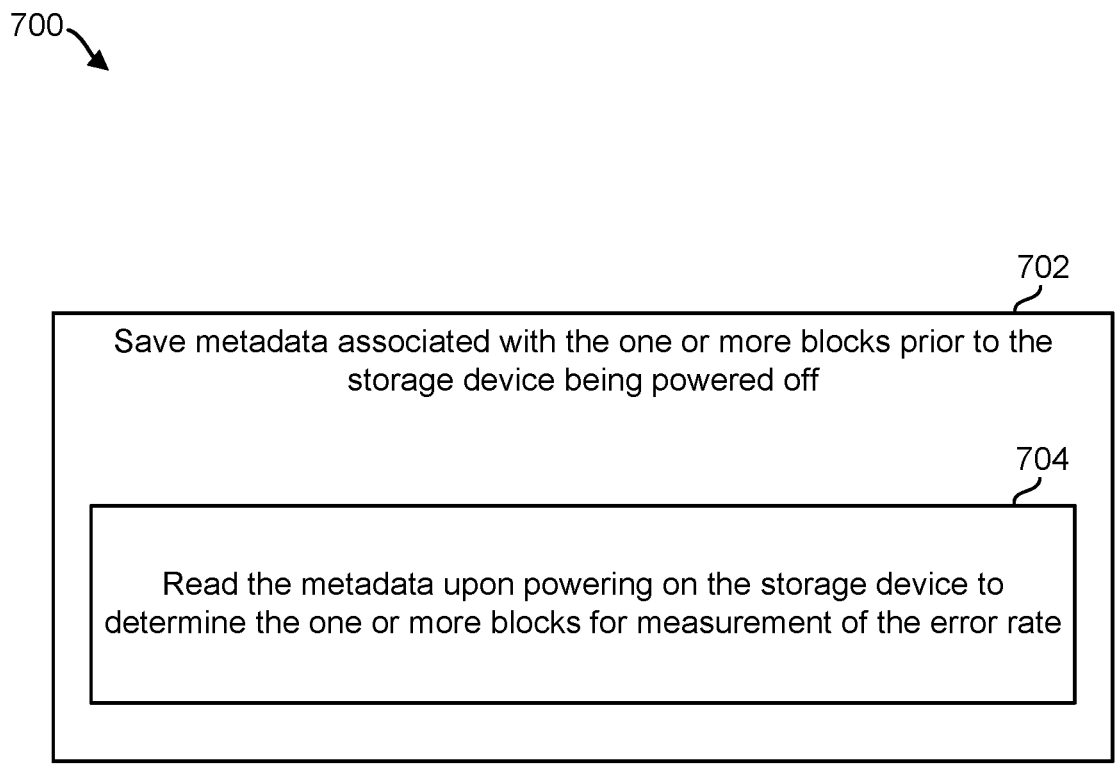
FIG. 7 is a flow diagram illustrating an example process for data recovery and block refresh process of a storage device.

FIG. 7 is a flow diagram illustrating an example process 700 for data retention after power off. The process 700 may be performed by a controller of a storage device (e.g., storage device 102 of FIG. 1) and may be used in connection with one or more of the steps illustrated in FIGS. 6, 8, and 9.

At 702, the controller may save metadata associated with the one or more blocks prior to the storage device being powered off. Here, the controller may scram one or more blocks, as illustrated in 404 of FIG. 4 or 504 of FIG. 5. For example, prior to power off, the controller may save metadata associated with one or more blocks that were last programmed prior to power off of the storage device. Thus, once the device is powered back on, the controller may identify the one or more blocks that were last programmed, and audit (e.g., as in 408/508 of FIGS. 4 and 5) those blocks.

At 704, the controller may read the metadata upon powering on the storage device to determine the one or more blocks for measurement of the error rate.

Figure 8:
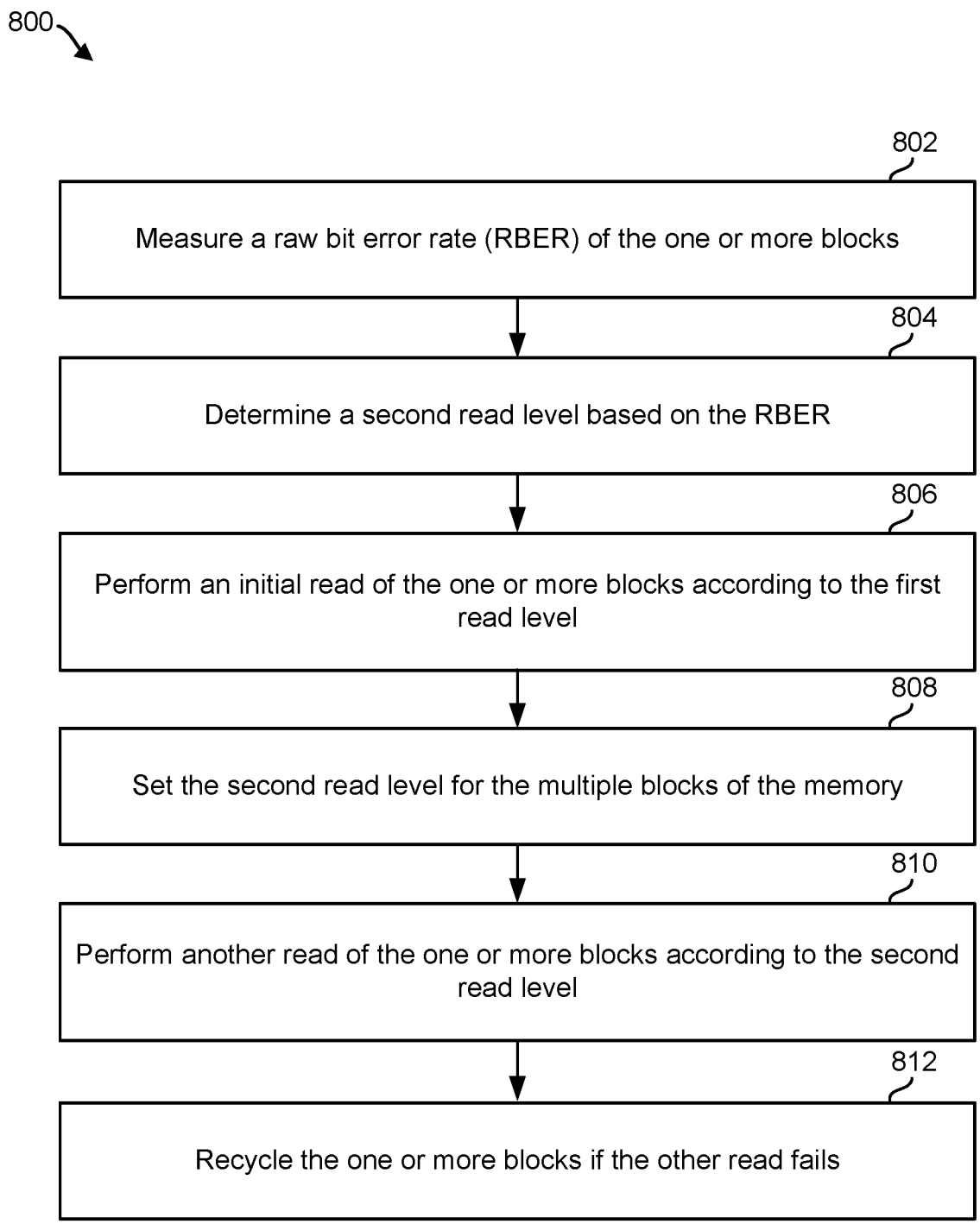
FIG. 8 is a flow diagram illustrating an example process for data recovery and block refresh process of a storage device.

FIG. 8 is a flow diagram illustrating an example process 800 for data retention after power off. The process 800 may be performed by a controller of a storage device (e.g., storage device 102 of FIG. 1) and may be used in connection with one or more of the steps illustrated in FIGS. 6, 7, and 9.

At 802, the controller may measure a raw bit error rate (RBER) of the one or more blocks. Here, the controller may measure the blocks, as illustrated in 510 of FIG. 5. In this example, the controller may measure the RBER in parallel auditing the one or more last programmed blocks.

At 804, the controller may determine a second read level based on the RBER, in connection with 516 of FIG. 5. Here, the measured RBER may be used to estimate a time shift and estimate an optimized read level relative to a read level determined based on BER.

At 806, the controller may perform an initial read of the one or more blocks according to the first read level, in connection with step 514 of FIG. 5 for example. Here, the controller may perform one or more reads using the read level estimated based on the BER. In some cases, the RBER measurement may take longer than the BER audit, so the read level based on the BER may be used first.

At 808, the controller may set the second read level for the multiple blocks of the memory, in connection with steps 516 and 518 of FIG. 5. For example, if the read using the read level based on the BER fails, the controller may check the RBER flag to see if the optimized read level has been determined based on the RBER. If the flag is set, then the controller may set the read level using the optimized read level based on the RBER. The optimized read level may be set for all dies in the memory.

At 810, the controller may perform another read of the one or more blocks according to the second read level, in connection with step 520 of FIG. 5. Here, the controller may perform another read of one or more blocks using the optimized read level. If the read fails, the controller may recycle the read block(s), at 812. If the read is successful, then the controller may perform reads as normal.

Figure 9:
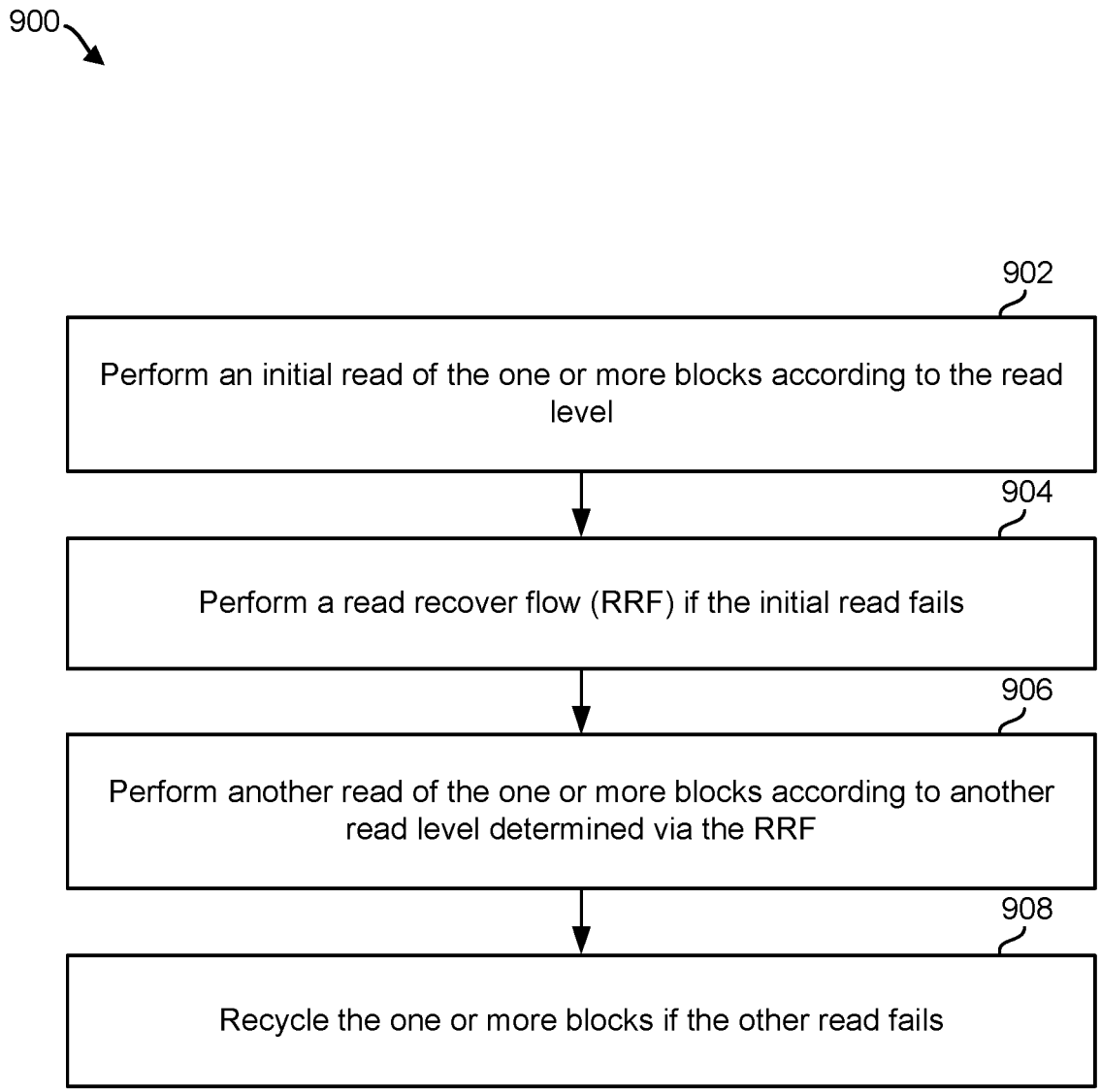
FIG. 9 is a flow diagram illustrating an example process for data recovery and block refresh process of a storage device.

FIG. 9 is a flow diagram illustrating an example process 900 for data retention after power off. The process 900 may be performed by a controller of a storage device (e.g., storage device 102 of FIG. 1) and may be used in connection with one or more of the steps illustrated in FIGS. 6-8.

At 902, the controller may perform an initial read of the one or more blocks according to the read level, in connection with steps 410 of FIG. 4 and 510 of FIG. 5. In this example, the read level may be based on the audit 408 of FIG. 4, or the audit 508 of FIG. 5.

At 904, the controller may perform a read recover flow (RRF) if the initial read fails, in connection with step 414 of FIG. 4. Here, the controller may perform an RRF of each failed block of each die individually.

At 906, the controller may perform another read of the one or more blocks according to another read level determined via the RRF, in connection with 412 of FIG. 4. For example, after RRF, the controller may determine an updated read value and attempt one or more reads using the updated read value.

At 908, the controller may recycle the one or more blocks if the other read fails, in connection with 422 of FIG. 4. In this example, the controller may recycle a block or die if the failed bit count (FBC) is greater than a threshold value.

Figure 10:
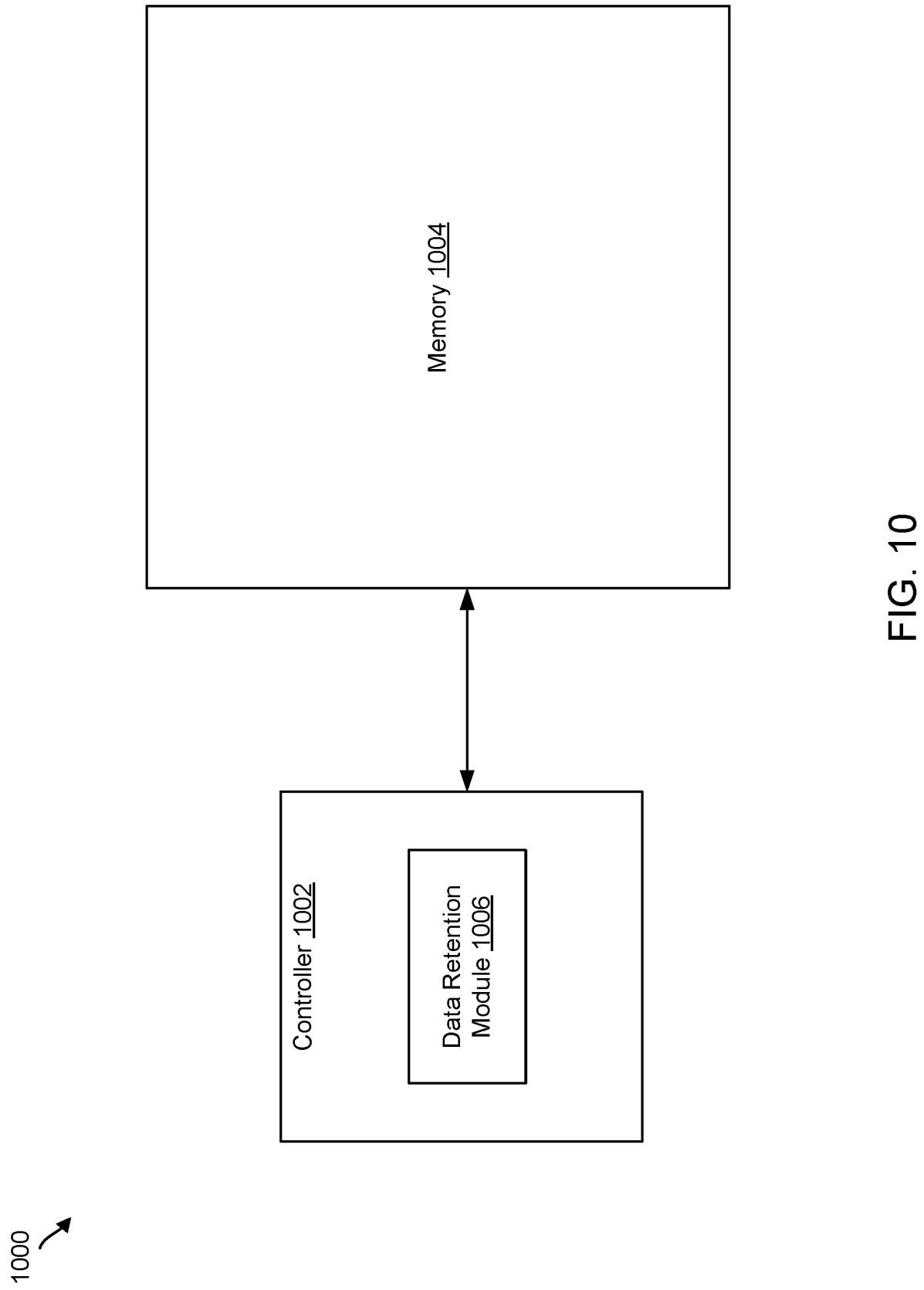
FIG. 10 is a conceptual diagram illustrating an example of a controller that configured to perform data recovery and block refresh process of a storage device.

FIG. 10 is a conceptual diagram illustrating an example of a controller 1002 that configured to perform data retention operations of a memory 1004 after shutdown. As illustrated in FIG. 10, the controller 1002 is coupled to the memory 1004 (e.g., NAND) in a storage device 1000. For example, controller 1002 may correspond to controller 123/333 of FIGS. 1 and 3 and memory 1004 may correspond to the memory NVM 110 the storage devices 102 of FIG. 1. The controller 1002 may be implemented in software, hardware, or a combination of hardware and software. In one exemplary embodiment, the controller 1002 is implemented with several software modules executed on one or more processors, but as those skilled in the art will appreciate, the controller 1002 may be implemented in different ways. The skilled artisan will readily understand how best to implement the controller 1002 based on the particular design parameters of the system.

The data retention module 1006 may provide means for performing the aforementioned processes described in FIGS. 4-9.

For example, the self-test module 1006 may provide a means for measuring an error rate of one or more blocks of the memory; means for estimating, based at least in part on the error rate, a time shift indicative of a duration of time for which the storage device was powered off; means for setting a read level for multiple blocks of the memory, wherein the read level is determined based at least in part on the time shift; means for saving metadata associated with the one or more blocks prior to the storage device being powered off; means for reading the metadata upon powering on the storage device to determine the one or more blocks for measurement of the error rate; means for measuring a raw bit error rate (RBER) of the one or more blocks; means for determining a second read level based on the RBER; means for performing an initial read of the one or more blocks according to the first read level; means for setting the second read level for the multiple blocks of the memory; means for performing another read of the one or more blocks according to the second read level; means for recycling the one or more blocks if the other read fails; means for performing an initial read of the one or more blocks according to the read level; means for performing a read recover flow (RRF) if the initial read fails; means for performing another read of the one or more blocks according to another read level determined via the RRF; and means for recycling the one or more blocks if the other read fails.

Means for performing, means for measuring, means for estimating, means for setting, means for saving, means for reading, means for determining, and means for recycling may include one or more of the controller 123 and/or the NVM 110 or memory 103 of FIG. 1.

In certain aspects, the error rate is a raw bit error rate (RBER) or a bit error rate (BER).

In certain aspects, the error rate measurement is triggered by powering on the storage device from a powered off state.

In certain aspects, the one or more blocks of the memory are last blocks to be programmed prior to storage device being powered off.

In certain aspects, the estimated data retention time is further based on a threshold RBER indicative of a configured maximum bit error rate.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a memory; and
   a controller coupled to the memory and configured to:
   measure an error rate of one or more blocks of the memory;
   estimate, based at least in part on the error rate, a time shift indicative of a duration of time for which the storage device was powered off;
   set a first read level for multiple blocks of the memory, wherein the first read level is determined based at least in part on the time shift;
   perform an initial read of the one or more blocks of the memory according to the first read level;
   perform a read recover flow (RRF) if the initial read fails; and
   perform another read of the one or more blocks of the memory according to a second read level determined via the RRF.

2. The storage device of claim 1, wherein the error rate is a raw bit error rate (RBER).

3. The storage device of claim 1, wherein the error rate measurement is triggered by powering on the storage device from a powered off state.

4. The storage device of claim 1, wherein the one or more blocks of the memory are last blocks to be programmed prior to storage device being powered off.

5. The storage device of claim 4, wherein the controller is further configured to:

save metadata associated with the one or more blocks of the memory prior to the storage device being powered off; and read the metadata upon powering on the storage device to determine the one or more blocks of the memory for measurement of the error rate.

6. The storage device of claim 1, wherein the controller is further configured to recycle the one or more blocks of the memory if the other read fails.

7. A method of management of data stored in a memory of a storage device, comprising:

saving metadata associated with one or more blocks of the memory prior to the storage device being powered off, the metadata indicative of the one or more blocks of the memory being a last one or more blocks of the memory to be programmed prior to the storage device being powered off;

reading the metadata upon powering on the storage device to determine the one or more blocks of the memory for measurement of an error rate;

measuring the error rate of the one or more blocks of the memory, wherein the measuring the error rate is triggered by the powering on of the storage device;

estimating, based at least in part on the error rate, a time shift indicative of a duration of time for which the storage device was powered off; and setting a read level for multiple blocks of the memory, wherein the read level is determined based at least in part on the time shift.

8. The method of claim 7, wherein the error rate is a raw bit error rate (RBER).

9. The method of claim 7, wherein the error rate is a bit error rate (BER), wherein the read level is a first read level, and wherein the method further comprises:

measuring a raw bit error rate (RBER) of the one or more blocks of the memory; and determining a second read level based on the RBER.

10. The method of claim 9, wherein the method further comprises performing an initial read of the one or more blocks of the memory according to the first read level.

11. A non-transitory computer-readable medium having instructions stored thereon that, when executed by a storage device controller of a storage device comprising a memory, cause the storage device controller to perform operations comprising:

saving metadata associated with one or more blocks of the memory prior to the storage device being powered off, the metadata indicative of the one or more blocks of the memory being a last one or more blocks of the memory to be programmed prior to the storage device being powered off;

reading the metadata upon powering on the storage device to determine the one or more blocks of the memory for measurement of an error rate;

measuring the error rate of the one or more blocks of the memory, wherein the measuring the error rate is triggered by the powering on of the storage device;

estimating, based at least in part on the error rate, a time shift indicative of a duration of time for which the storage device was powered off; and setting a read level for multiple blocks of the memory, wherein the read level is determined based at least in part on the time shift.

12. The non-transitory computer-readable medium of claim 11, wherein the error rate is a bit error rate (BER), wherein the read level is a first read level, and wherein the operations further comprise:

measuring a raw bit error rate (RBER) of the one or more blocks of the memory; and determining a second read level based on the RBER.

13. The non-transitory computer-readable medium of claim 12, wherein the operations further comprise performing an initial read of the one or more blocks of the memory according to the first read level.

14. The non-transitory computer-readable medium of claim 13, wherein the operations further comprise:

setting the second read level for the multiple blocks of the memory; and performing another read of the one or more blocks of the memory according to the second read level.

15. The non-transitory computer-readable medium of claim 14, wherein the operations further comprise:

recycling the one or more blocks of the memory if the other read fails.

16. The non-transitory computer-readable medium of claim 11, wherein the error rate is a raw bit error rate (RBER), and wherein the operations further comprise:

performing an initial read of the one or more blocks of the memory according to the read level.

17. The non-transitory computer-readable medium of claim 16, wherein the operations further comprise:

performing a read recover flow (RRF) if the initial read fails; and performing another read of the one or more blocks of the memory according to another read level determined via the RRF.

18. The non-transitory computer-readable medium of claim 17, wherein the operations further comprise:

recycling the one or more blocks of the memory if the other read fails.

* * * * *